United States Patent

[11] 3,619,645

[72] Inventor Anthony J. Chernoske
Indianapolis, Ind.
[21] Appl. No. 817,349
[22] Filed Apr. 18, 1969
[45] Patented Nov. 9, 1971
[73] Assignee P. R. Mallory & Co., Inc.
Indianapolis, Ind.

[54] FREQUENCY DIVIDER
7 Claims, 3 Drawing Figs.

[52] U.S. Cl. .......... 307/225,
307/215, 307/218, 307/265, 307/273
[51] Int. Cl. .......... H03k 21/10
[50] Field of Search .......... 328/207, 273, 225, 265; 307/265, 273, 215, 218, 225

[56] References Cited

UNITED STATES PATENTS

| | | | |
|---|---|---|---|
| 3,317,843 | 5/1967 | Emmons .......... | 328/207 X |
| 3,327,226 | 6/1967 | Nourney .......... | 307/273 X |
| 3,443,232 | 5/1969 | Stinson .......... | 307/265 X |
| 3,454,884 | 7/1969 | Ziehm .......... | 307/265 X |

*Primary Examiner*—John S. Heyman
*Attorneys*—Richard H. Childress, Robert F. Meyer, Henry W. Cummings and C. Carter Ells, Jr.

ABSTRACT: The disclosure is directed to an integratable and programmable frequency divider including a bistable, fixed period generator, a NAND circuit and an AND circuit interconnected so as to provide, among other things, an output of fixed and determinable pulse widths independent of frequency.

INVENTOR
ANTHONY J. CHERNOSKE
BY C. Carter Ells
ATTORNEY

INVENTOR
ANTHONY J. CHERNOSKE
BY C. Carter Ells
ATTORNEY

FREQUENCY DIVIDER

The present invention relates to frequency dividers, in general, and more specifically to such a divider which is both programmable and integratable using conventional and well known techniques in the art. These features make it readily useable in connection with modern electronic digital computers, though not limited to use therein. Generally, it is useable in connection with any electronic system wherein it is necessary to provide characteristics such as fixed and determinable output pulse widths being independent of frequency. An example of such a system is a typical FM detector system using numerous filters in connection therewith.

Integrated circuits involve the use of a substrate of semiconductor material, and the creation of diffused junctions in the substrate to constitute active elements such as transistors, diodes and the like. Other circuit elements, commonly called passive elements, such as resistors, capacitors, and conductors are also formed on the substrate in accordance with known techniques. The instant device consists of transistors, diodes and resistors and is therefore readily integratable using known techniques.

The particular circuitry illustrative of one embodiment of the instant invention takes advantage of the improved results in using integrated circuits instead of their conventional counterparts. Some of these advantages are greatly reduced size and weight, lower production cost, improved reliability, potentially improved performance, etc.

From an operational and functional standpoint, the instant frequency divider has been found extremely useful in connection with systems desirous of obtaining a fixed and determinable output pulse width independent of frequency. An example of such a system is an FM detector system using a pulse averaging detector in connection with a multiplicity of filters, as well as conventional attenuators, demodulators, amplifiers and detectors. A well-known problem in the detection of FM signals in such a system, is the interference of noise and other extraneous and undesirable signals on the output signal to be received by the detector. The usual method of minimizing the effects of noise, etc. is the use of various types of filters placed throughout the system. There are two disadvantages, however, in using filters to obtain the desired FM signal having a minimal amount of noise and other interferring signals. The first disadvantage is that there is a minimal level of elimination which can be accomplished by use of these filters, while the second disadvantage is the costly design problems encountered when such filters are used in a given system. In other words, in order to obtain an increasing amount of purity in the FM signal, the filters must operate at extremely high efficiencies which, correspondingly, raises the cost of such filters. Frequently, the effectiveness of such filters is sacrificed for cost, thus resulting in an FM signal of undesired purity.

A feature of this frequency divider is that it provides a fixed and determinable output pulse width independent of frequency which permits a greater latitude in the design considerations involving the filters used in connection with, for example, an FM detector system. This is accomplished by permitting only fixed frequencies to pass through the frequency divider, thereby eliminating substantially the effects of noise and other interferring signals on the FM signal transmitted.

It is an object of the invention to provide an integratable and programmable frequency divider which functions to provide a fixed and determinable output pulse width independent of frequency which is readily useable in connection with digital computers.

Another object of the invention is to provide a frequency divider utilizing the functions of a bistable output, a fixed period generator and gating circuits to provide characteristics such as fixed and determinable output pulse width independent of frequency, complementary outputs, and an output frequency of predetermined amount compared to the input frequency.

Still another object of the invention is to provide an integratable frequency divider for providing a fixed and determinable output pulse width independent of frequency, which can be readily used in connection with, for example, an FM detector system.

Yet another object of the invention is to provide a frequency divider which provides a fixed and determinable output pulse width independent of frequency to be used in connection with, for example, an FM detector system whereby the design requirements of the filter components used in such systems is greatly facilitated, thereby reducing the number of such filters and correspondingly the cost thereof.

Still another object of the invention is to provide a frequency divider utilizing the functions of a bistable output, a fixed period generator and gating circuits, wherein the fixed period generator utilizes a memory element whereby the fixed period generator is prevented from being triggered before the previous fixed period has been completed.

Other features, advantages and objects of the invention will become apparent from a consideration of the following description when taken in conjunction with the accompanying drawings, in which.

Figure 1:
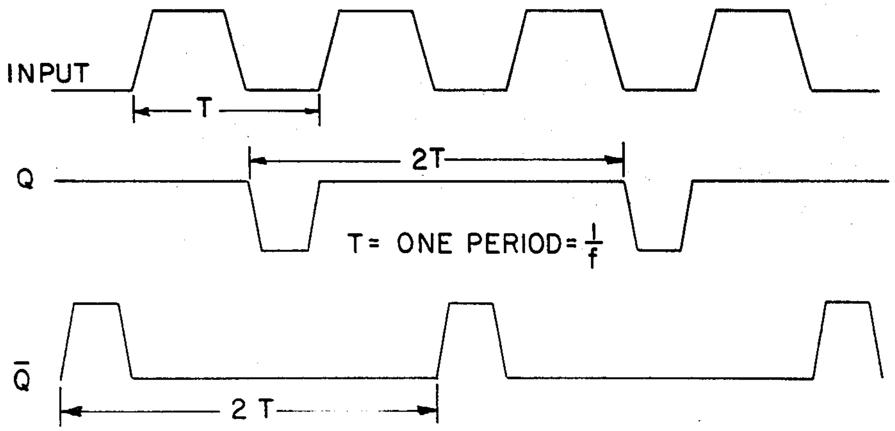
FIG. 1 is a diagram illustrating the voltage inputs and the two voltage outputs of the instant invention.

Referring now to FIG. 1, there is shown a typical input voltage to be applied to the input of the instant frequency divider. The outputs, shown as Q and $\overline{Q}$ illustrate the wave form to be transmitted by this frequency divider. The outputs, Q and $\overline{Q}$, are one-half of the input frequency, as in most frequency dividers, but they are not symmetrical in that there is a transition to the opposite state for a finite duration of time. For example, it can be seen that Q and $\overline{Q}$ are either in a ONE or a ZERO state at given times. Generally, it is the finite duration of time at the output that permits this frequency divider to function differently from most of the conventional dividers. This finite period of time is accomplished by use of a timing circuit which in the instant invention is illustrated as being an improved monostable whose function is more fully discussed in connection with FIG. 2 below.

Figure 2:
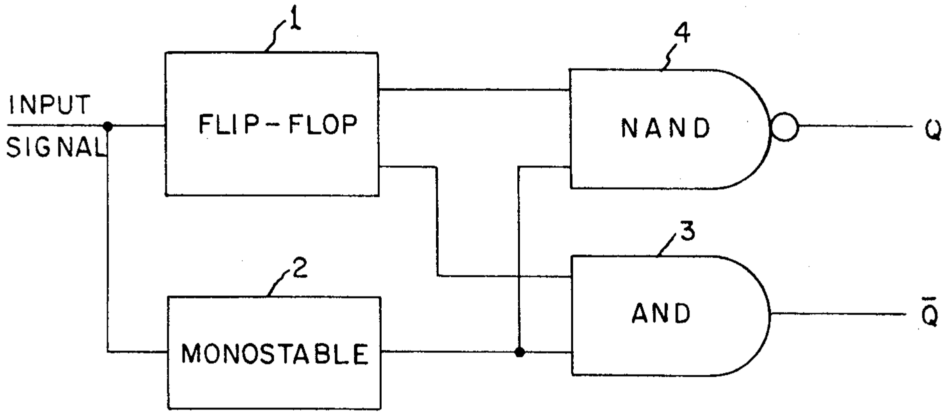
FIG. 2 is a block diagram of one embodiment of the invention.

In FIG. 2, we see four basic components implementing the system, namely, flip-flop 1, monostable 2, NAND gate 4, and AND gate 3. Although a flip-flop 1 is shown in the illustration of the preferred embodiment of the device, almost any type of bistable may be substituted in a given system if so desired. Further, the monostable 2 may be other forms of timing circuits, such as a fixed period generator. The input signal is fed into the flip-flop 1 and the monostable 2. Generally, the output from the flip-flop would be all that is necessary for the conventional frequency divider. In the instant frequency divider, the input signal is also fed into the monostable 2 which acts to provide a fixed pulse width for each positive Q, negative signal crossing or zero triggering point at its output. Thus it can be seen that the output from the monostable 2 is a fixed pulse width of finite duration which is readily programmable by conventional means. This output from the monostable 2 is then NANDed together with the output from the flip-flop 1, the monostable output being ANDed together with the complementary output of the flip-flop 1. The functions of the NAND gate and the AND gate are well defined and well known in the art and will be only briefly discussed below. An AND gate functions such that a given set of inputs will result in a ONE for ONE at the output. Conversely, if any input goes to zero, the output will be a ZERO. The NAND gate differs from the AND gate in that it has an extra level of inversion on its output. For example, if all of the inputs are ONE, a ZERO is outputed, and if any input goes to ZERO, a ONE is outputed. An important aspect of the instant frequency divider is that the outputs at the AND and NAND gates namely, Q and $\overline{Q}$ are independent of frequency as is clearly shown in FIG. 1. This is accomplished by use of the monostable 2, or some other form of fixed period generator, in connection with the AND and NAND fixed gates.

Figure 3:
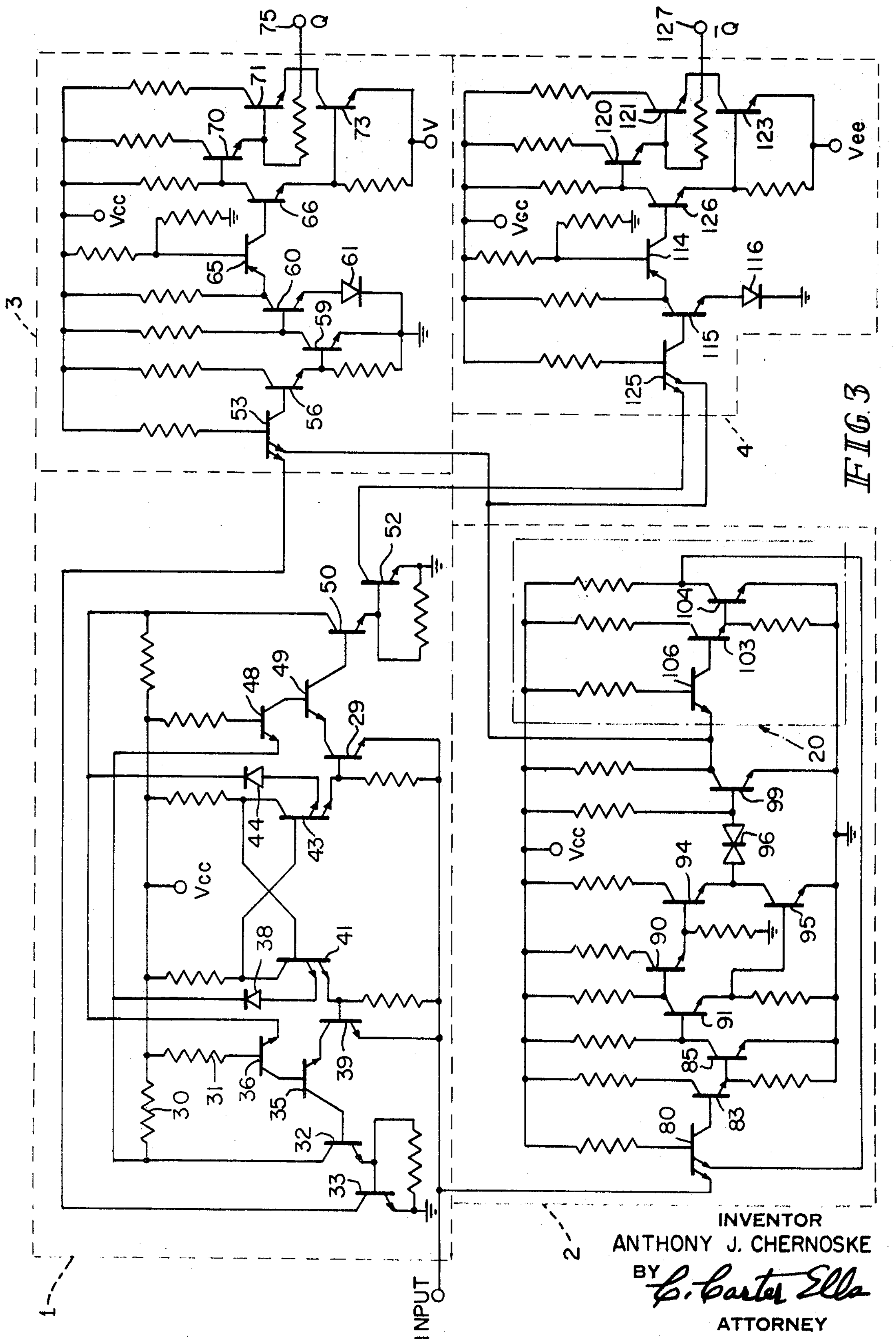
FIG. 3 is an electrical circuit diagram of the embodiment shown in FIG. 2.

FIG. 3 is a detailed circuit diagram of the components shown in the block diagram of FIG. 2. Note that each section of the circuit diagram of representing the flip-flop 1, the monostable 2, the AND 3 and the NAND 4, have been isolated by the respective dotted lines with appropriate numerals referring to each. Note also, that the entire electrical circuit consists of transistors, diodes and resistors, all of which are readily integratable using known techniques and materials. Basically, each of the resistors illustrated act as biasing means for the respective transistors to which they are connected. For example, resistor 30 is a collector biasing means for transistor 32, while resistor 31 acts as a base biasing means for transistor 36. Obviously, some of the transistors, while functioning primarily as switching elements in the circuit disclosed, will also act to bias other transistors to which they are connected. For example, transistor 36 in conjunction with resistor 31 will act as a base biasing means on transistor 35. In view of the foregoing statements, it is deemed unnecessary to refer to each of the resistors and transistors functioning as biasing means throughout the circuit since to do so would not add substantially to the explanation of the system.

Referring now to the circuitry in connection with the flip-flop 1 shown in FIG. 3, transistor 33 is of the NPN type and functions as an output transistor. All transistors in the entire frequency divider circuit are of the NPN type with the exception of transistor 65 and transistor 114 shown in AND 3 and NAND 4, respectively. Basically, transistor 32 is a phase splitting transistor, transistor 35 is the input along with transistor 36, diode 38 provides a dual function of level splitting and emitter biasing of transistor 41, transistor 41 functioning as a memory element, while transistor 39 functions as a steering element. Note that transistor 41 is a multiple emitter type of integrated transistor. Bearing in mind that this is a flip-flop, transistor 43, 29, 48, 49, 50 and 51 correspond to transistors 41, 39, 36, 35, 32 and 33, respectively, and their functions, during an operative period, will be identical to that of their respective counterparts. For example, transistor 33 corresponds to transistor 52 and each function as output transistors. $V_{cc}$ is the DC collector supply voltage for flip-flop 1. Flip-flop 1 operates in the usual manner well known in the art and is sometimes called a bistable multivibrator.

Referring now to the monostable 2 shown in circuit diagram of FIG. 3, it should be noted that Memory circuit 20 is a modification to the remaining portion of the circuitry which constitutes a conventional monostable, the former of whose function and operation will be discussed in more detail below. Transistor 80 acts as an input element having a multiple emitter. Transistors 83, 85 and 90 function as biasing elements to the transistors to which they are respectively connected. Transistor 91 functions as a phase splitter, while transistors 94 and 95 act as driving means for back-to-back diode 96. Note that element 96 functions as a capacitor because of the fundamental characteristics of two diodes placed back-to-back, the diodes being so arranged so as to facilitate their integratability. Transistor 95 and transistor 99 function as output elements.

Elements 100, 101, 102, 103, 104, 105 and 106 comprise Memory element 20 and are enclosed in a dot-dash box in FIG. 3. Transistor 106 acts as the input element to Memory 20 while transistor 103 is a biasing element of transistor 104 which acts as the output element of the Memory 20. Basically, Memory element 20 functions in connection with monostable 2 as follows: Memory element 20 basically functions as a NAND gate which is connected to the output stage of monostable 2 at the collector of transistor 99. The output of Memory 20 is then fed back to the Memory emitter of multiple emitter transistor 80. The function of the Memory circuit is to prevent the monostable from triggering when an input signal is applied to transistor 80 before the previous fixed period is completed.

Basically, monostable 2 functions in a manner well known in the digital computer field except for the effect of Memory Circuit 20 which is deemed to be unique in connection with monostable circuits.

The AND circuit 3 in FIG. 3 is comprised of a combination of transistors, diodes and resistors and operates in the usual manner well known to those skilled in the digital computer art. Multiple emitter transistor 53 is the input element, while transistors 71 and 73 are the output elements of the AND gate. Transistors 56, 61 and 70 act as biasing means for the respective transistors to which they are connected. Transistors 59, 60 and 66 are phase shifting transistors. Transistor 65 is a level shifting or interface type switching means which acts to shift the voltage level of transistor 66. $V_{cc}$ is a DC collector supply voltage for AND, while $V_{ee}$ is a DC emitter supply voltage therefor. The output of AND 3 is shown by reference 75 and is designated as Q.

The NAND 4 shown in the circuit diagram of FIG. 3 is comprised of a combination of transistors, a diode, and a multiplicity of biasing resistors. Multiple emitter transistor 125 is the input element for the NAND 4, while transistors 121 and 123 act as the output elements. Transistors 115 and 126 act as phase splitting elements. Transistor 114 functions as a voltage level shifter. Biasing diode 116 acts as a bias element for the emitter of transistor 115. Transistor 70 is a base biasing means for transistor 71. The output voltage $\bar{Q}$ of NAND 4 is shown at terminal 127. $V_{ee}$ is a DC emitter supply voltage.

In a modification of the AND 3 and NAND 4, the overall frequency divider has been found to function satisfactorily with the use of ZENER diodes in place of several elements in each of the respective circuits. For example, in the AND 3, elements 63, 64 and 65 may be completely eliminated from the circuit and in place thereof, a ZENER diode may be placed between the base of transistor 66 and the emitter of transistor 60 in a forward-biased manner with respect to transistor 66. Correspondingly, in NAND 4, elements 112, 113 and 114 may be eliminated and in place thereof a Zener diode may be connected between the base of transistor 126 and the emitter of transistor 115 in a forward-biased manner with respect to transistor 126. In some operations, AND and NAND circuits have been found to perform more efficiently using the above-mentioned ZENER diodes. A brief description of the operation of the invention disclosed follows:

Referring to FIG. 2, when the input signal goes from ZERO to ONE, flip-flop 1 and monostable 2 become preset. Next the input goes from a ONE to a ZERO which action causes the flip-flop 1 to conjugate or change states and causes the monostable 2 to emit a ONE-state pulse output. Normally the monostable output is ZERO at all times. Whichever of the gates (AND 3 or NAND 4) has a ONE on each of its two inputs produces a ONE-out (in the case of the AND 3), or a ZERO-out (in the case of the NAND 4). The gate outputs remain in their respective states until the ONE on the input of either of the respective gates from the monostable 2 is removed. Then the cycle is repeated after each second period designated in FIG. 1 as T. This is because the flip-flop 1 reconjugates or changes states again during the second period T. Thus it can be seen the system disclosed is an improved integratable and programmable frequency divider which functions to provide characteristics including a fixed and determinable output pulse width independent of frequency, complementary outputs and an output frequency of predetermined amount compared to the input frequency.

Obviously, many modifications and variations of the present invention are possible in light of the above teachings. It is therefore to be understood that within the scope of the appended claims the invention may be practiced otherwise than as specifically described.

Having thus described my invention, I claim

1. An integratable and programmable frequency divider comprising:

a flip-flop having an input and two outputs, a fixed period generator including a multiplicity of switching stages connected between the input and the output of said fixed period generator, the input of said fixed period generator connected to the input of said flip-flop for receiving a signal, the output stage of said fixed period generator being comprised of a PNP transistor having a base, collector and emitter, said collector adaptable to be connected to a voltage power supply, said base being connected to a preceding stage in said fixed frequency generator and said emitter being connected to ground, a memory device having an input and an output, the input of said memory device being connected to the collector of said output stage transistor of said fixed period generator, the output of said memory device being connected to the input stage of said fixed period generator such that said fixed period generator is prevented from triggering when an input is applied to it before the previous fixed period is completed by said fixed period generator, and a plurality of gate circuits each having at least one input and one output, the inputs of said gate circuits being connected to the outputs of said flip-flop and said fixed period generator such that when a signal is received at the input of said flip-flop and fixed period generator, an output signal is transmitted to each of the outputs of said plurality of gates, said output signal having characteristics of fixed and determinable output pulse width independent of frequency.

2. An integratable and programmable frequency divider comprising:

a flip-flop having an input and two outputs, a fixed period generator including a multiplicity of switching stages connected between the input and output of said fixed period generator, the input of said fixed period generator connected to the input of said flip-flop for receiving a signal, the output stage of said fixed period generator being comprised of a PNP transistor having a base, collector and emitter, said collector adaptable to be connected to a voltage power supply, said base being connected to a preceding stage in said fixed period generator, and said emitter being connected to ground, a memory device having an input and an output, the input of said memory device being connected to the collector of said output stage transistor of said fixed period generator, the output of said memory device being connected to the input stage of said fixed period generator such that the fixed period generator is prevented from triggering when an input is applied to it before the previous fixed period is completed by said fixed period generator.

a NAND circuit having two inputs and an output, and an AND circuit having two inputs and an output, the first output of said flip-flop being connected to a first input of said NAND, the second output of said flip-flop being connected to a first input of said AND, and the output of said fixed period generator being connected to the second input of said NAND and said AND, respectively, such that when a signal is received at the input of said flip-flop and fixed period generator, the frequency divider will function so as to provide a fixed and determinable output pulse width independent of frequency at each of the said respective outputs of said AND and said NAND.

3. An integratable and programmable frequency divider according to claim 1, wherein:

said memory device comprises a first, second and third PNP transistor, each having a base, collector and emitter, a first, second, third and fourth biasing resistor associated with said transistors, the emitter of said first transistor being connected to the collector of said output transistor in said fixed period generator, the base of said first transistor being connected to one end of said first resistor, the collector of said first transistor being connected to the base of said second transistor, the collector of said second transistor being connected to one end of a second resistor, the emitter of said second transistor being connected to the base of said third transistor, a third resistor connected at one of it's ends to the collector of said third transistor, the emitter of said third transistor being connected to ground, a fourth resistor connected between the base of said third transistor and ground, the other ends of said first, second and third resistor being connected together, and the collector of said third transistor being connected to the input stage of said flip-flop.

4. A frequency divider according to claim 2, wherein, said fixed period generator is a monostable.

5. An integratable and programmable frequency divider according to claim 2, wherein:

said memory device comprises a first, second and third PNP transistor, each having a base, collector and emitter, a first, second, third and fourth biasing resistor associated with said transistors, the emitter of said first transistor being connected to the collector of said output transistor in said fixed period generator, the base of said first transistor being connected to one end of said first resistor, the collector of said first transistor being connected to the base of said second transistor, the collector of said second transistor being connected to one end of a second resistor, the emitter of said second transistor being connected to the base of said third transistor, a third resistor connected at one of it's ends to the collector of said third transistor, the emitter of said third transistor being connected to ground, a fourth resistor connected between the base of said third transistor and ground, the other ends of said first, second and third resistor being connected together, and the collector of said third transistor being connected to the input stage of said flip-flop.

6. An integratable and programmable electronic circuit comprising:

a flip-flop having an input and two outputs, a fixed period generator having a multiplicity of stages including a multiple emitter input stage and an output stage, a first one of said multiple emitters being connected to the input of said flip-flop for receiving a signal, and a memory circuit connected between the output and a second one of said multiple emitters of said fixed period generator such that the fixed period generator is prevented from triggering when an input signal is applied to it before the previous fixed period is completed by said fixed period generator.

7. An integratable and programmable electronic circuit according to claim 6, further including:

a NAND circuit having two inputs and an output, and an AND circuit having two inputs and an output, the first output of said flip-flop being connected to a first input of said NAND, the second output of said flip-flop being connected to the first input of said AND, and the output of said fixed period generator being connected to the second input of said NAND and said AND, respectively, such that when a signal is applied to the input of said flip-flop and said fixed period generator an output signal will be transmitted to each of the outputs of said AND and NAND, said output signals having characteristics of a fixed and determinable output pulse width independent of frequency.

* * * * *